United States Patent
Horiuchi et al.

(10) Patent No.: US 9,585,292 B2
(45) Date of Patent: Feb. 28, 2017

(54) POWER CONVERTER

(71) Applicant: HITACHI AUTOMOTIVE SYSTEMS, LTD., Hitachinaka-shi, Ibaraki (JP)

(72) Inventors: Keisuke Horiuchi, Tokyo (JP); Yosei Hara, Hitachinaka (JP); Morio Kuwano, Hitachinaka (JP); Atsuo Nishihara, Tokyo (JP); Kinya Nakatsu, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 13 days.

(21) Appl. No.: 14/767,000

(22) PCT Filed: Jan. 31, 2014

(86) PCT No.: PCT/JP2014/052190
§ 371 (c)(1),
(2) Date: Aug. 11, 2015

(87) PCT Pub. No.: WO2014/132739
PCT Pub. Date: Sep. 4, 2014

(65) Prior Publication Data
US 2015/0382501 A1    Dec. 31, 2015

(30) Foreign Application Priority Data

Feb. 27, 2013 (JP) .................................. 2013-036565

(51) Int. Cl.
*H05K 7/20* (2006.01)
*H02M 7/539* (2006.01)
(Continued)

(52) U.S. Cl.
CPC .......... *H05K 7/2089* (2013.01); *H02M 7/539* (2013.01); *H05K 7/20927* (2013.01); *H02M 7/003* (2013.01); *H02M 7/5387* (2013.01)

(58) Field of Classification Search
CPC .. H02M 3/3382; H02M 3/3384; H02M 3/337; H02M 3/3155; H02M 3/325;
(Continued)

(56) References Cited

U.S. PATENT DOCUMENTS 5,631,821 A * 5/1997 Muso ................. H05K 7/20927
361/709
6,215,682 B1 * 4/2001 Akamatsu ............. H01L 23/473
257/E23.098
(Continued)

FOREIGN PATENT DOCUMENTS

JP    2010-110143 A    5/2010
JP    2012-161242 A    8/2012
(Continued)

*Primary Examiner* — Adolf Berhane
(74) *Attorney, Agent, or Firm* — Volpe and Koenig, P.C.

(57) ABSTRACT

A power converter includes a power semiconductor module, a first flow path forming body and a second flow path forming body that forms a housing space for storing the power semiconductor module and the first flow path forming body, in which the first flow path forming body is configured of a first side wall section, a second side wall section, and a bottom surface section, the first side wall section forms a first flow path space between one surface of the power semiconductor module and the first side wall section, the second side wall section forms a second flow path space between the other surface of the power semiconductor module and the second side wall section, and cooling refrigerant flows through the housing space, the first flow path space, and the second flow path space.

9 Claims, 16 Drawing Sheets

(51) Int. Cl.
*H02M 7/00* (2006.01)
*H02M 7/5387* (2007.01)

(58) Field of Classification Search
CPC ...... H02M 3/335; H02M 7/003; H02M 7/537;
H02M 7/539; H05K 7/2089; H05K
7/20218; H05K 7/20927; H05K 7/70;
H05K 7/003
USPC ........ 363/131, 132, 141, 144; 361/676, 688,
361/689, 699
See application file for complete search history.

(56) References Cited

U.S. PATENT DOCUMENTS

| | | | | |
|---|---|---|---|---|
| 6,262,906 | B1 * | 7/2001 | Salzmann | H05K 7/1432 363/141 |
| 6,424,550 | B2 * | 7/2002 | Grundl | H02M 7/68 257/E25.012 |
| 6,621,701 | B2 * | 9/2003 | Tamba | H05K 7/20927 165/80.4 |
| 6,735,968 | B2 * | 5/2004 | Kurita | F25B 49/025 361/735 |
| 6,865,080 | B2 * | 3/2005 | Radosevich | B60L 11/12 165/80.4 |
| 7,692,923 | B2 * | 4/2010 | Nakamura | H05K 7/20927 165/104.33 |
| 7,830,689 | B2 * | 11/2010 | Nakamura | H02M 7/003 363/141 |
| 7,965,510 | B2 * | 6/2011 | Suzuki | B60K 6/365 165/80.4 |
| 8,064,234 | B2 * | 11/2011 | Tokuyama | H01L 23/473 363/132 |
| 8,228,700 | B2 * | 7/2012 | Yahata | H02M 7/003 361/601 |
| 8,240,411 | B2 * | 8/2012 | Nakatsu | B60L 11/00 180/65.21 |
| 8,462,531 | B2 * | 6/2013 | Nishikimi | H05K 7/20927 361/679.46 |
| 8,553,414 | B2 * | 10/2013 | Chinthavali | H05K 7/20918 361/695 |
| 8,644,045 | B2 * | 2/2014 | Hamatani | H02M 1/32 323/351 |
| 8,675,364 | B2 * | 3/2014 | Tokuyama | B60K 6/365 165/185 |
| 8,780,557 | B2 * | 7/2014 | Duppong | H05K 7/209 165/80.4 |
| 8,787,056 | B2 * | 7/2014 | Yamahira | H01R 13/6474 363/141 |
| 8,902,612 | B2 * | 12/2014 | Inuduka | H02M 7/003 361/328 |
| 8,917,509 | B2 * | 12/2014 | Tokuyama | H01L 23/36 361/699 |
| 8,958,225 | B2 * | 2/2015 | Ichijo | H02M 1/00 363/141 |
| 9,030,822 | B2 * | 5/2015 | Sharaf | H05K 7/20927 165/104.33 |
| 9,042,147 | B2 * | 5/2015 | Ishii | H02M 1/12 361/677 |
| 2008/0186751 | A1 | 8/2008 | Tokuyama et al. | |
| 2011/0299265 | A1 | 12/2011 | Nakatsu et al. | |
| 2014/0126154 | A1 | 5/2014 | Higuchi et al. | |

FOREIGN PATENT DOCUMENTS

| | | |
|---|---|---|
| JP | 2013-013255 A | 1/2013 |
| JP | 2013-31250 A | 2/2013 |

* cited by examiner

POWER CONVERTER

TECHNICAL FIELD

The present invention relates to a power converter and, particularly, to a power converter that is used in a hybrid electric vehicle or an electric vehicle.

BACKGROUND ART

In an electric vehicle or a hybrid electric vehicle, miniaturization or cost reduction of components to be mounted is important, a power converter converting a DC current of a battery into an AC current is not an exception and miniaturization or cost reduction thereof is being demanded. Accordingly, it is necessary to improve cooling performance because power density is increased as a result of this.

A power semiconductor module has the largest heat generation amount among electronic components configuring the power converter. In order to improve cooling performance of the power semiconductor module, a double-sided cooling structure (PTL 1) has been effective in which thermal grease having a large thermal resistance is removed and heat is radiated from both surfaces of a semiconductor device.

However, in the structure described in PTL 1, since the power semiconductor module and a flow path forming body are separately molded, it is necessary to provide a gap in addition to a flange section in consideration of assembling properties (particularly, between radiation fins and a wall surface of a flow path). Even if strict fitting tolerance is set and the gap is made small, due to a manufacturing variation of the power semiconductor module itself, there is a concern that interference by members may occur not in a sealing section. Particularly, if a plurality of power semiconductor modules are provided (a plurality of sealing sections are provided), it is not realistic to strictly regulate the fitting tolerance. Thus, if the power semiconductor module and the flow path forming body are separately molded, since there is certainly a finite gap with the variation and since cooling water flows through the gap in addition to a portion surrounding a heat radiation section to be flushed with cooling water in order to cool the power semiconductor module, there is a problem that cooling water bypasses heat radiation fins and cooling performance of the power semiconductor module cannot be sufficiently exhibited.

CITATION LIST

Patent Literature

PTL 1: JP-A-2010-110143

SUMMARY OF INVENTION

Technical Problem

An object of the invention is to achieve improvement of the cooling performance of a power semiconductor module and reduction of performance variation.

Solution to Problem

In order to achieve the object described above, a power converter according to the invention includes a power semiconductor module that converts a DC current into an AC current, a first flow path forming body and a second flow path forming body that forms a housing space for storing the power semiconductor module and the first flow path forming body, in which the first flow path forming body is configured of a first side wall section facing the power semiconductor module, a second side wall section facing the first side wall section with the power semiconductor module interposed therebetween, and a bottom surface section straddling a bottom surface of the power semiconductor module and connecting the first side wall section and the second side wall section, the first side wall section forms a first flow path space between one surface of the power semiconductor module and the first side wall section, the second side wall section forms a second flow path space between the other surface of the power semiconductor module and the second side wall section, and cooling refrigerant flows through the housing space, the first flow path space, and the second flow path space.

Advantageous Effects of Invention

According to the invention, it is possible to achieve improvement of the cooling performance of the power semiconductor module and reduction of performance variation.

DESCRIPTION OF EMBODIMENTS

Figure 1:
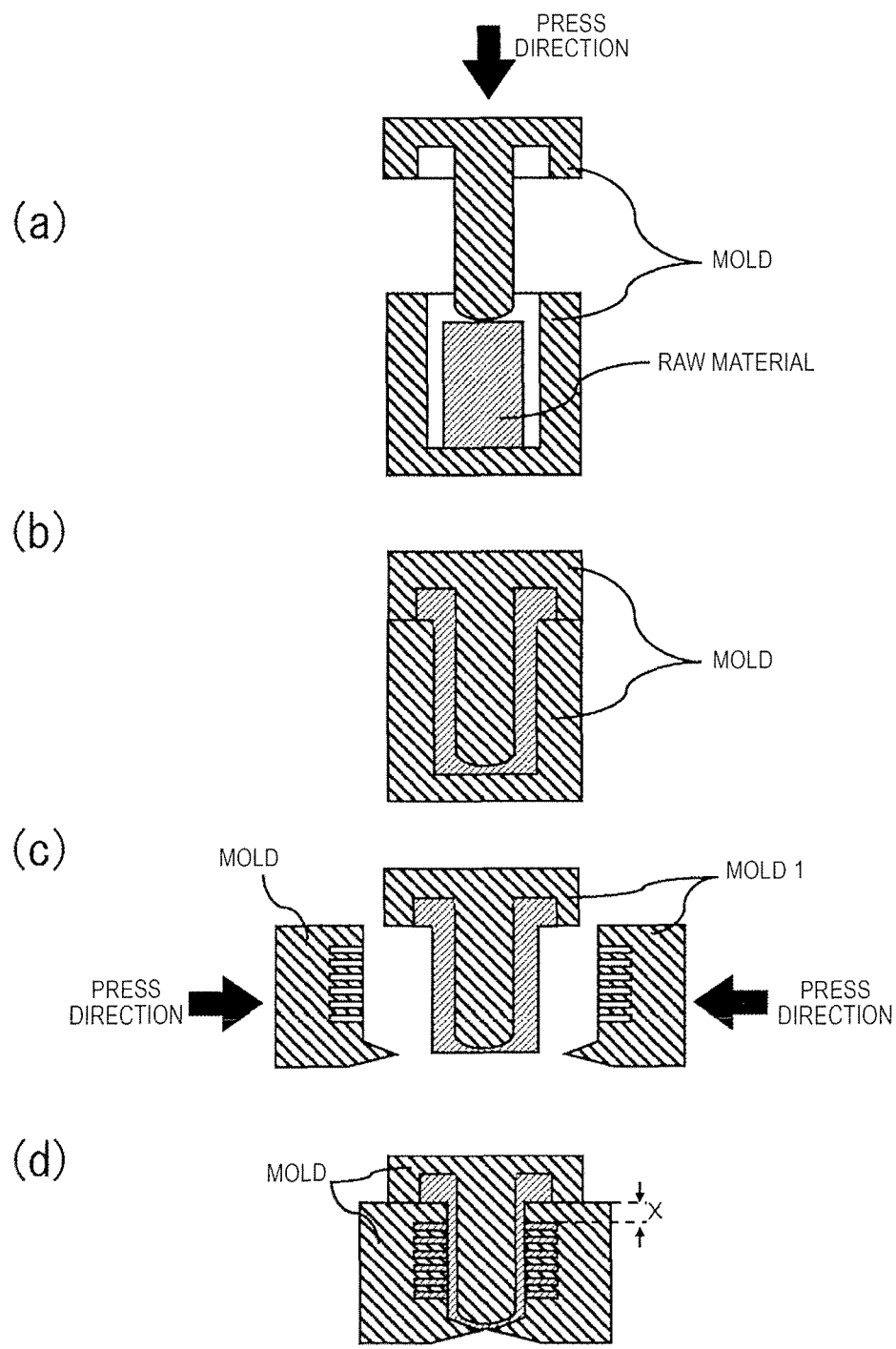
FIG. 1 illustrates a manufacturing method for forming a heat radiation fin section and a flange section with two forging processes.

FIG. 1 illustrates a manufacturing method in which a metal case with a fin is manufactured by forging and molding. FIGS. 1(a) and 1(b) illustrate a first step, and FIGS. 1(c) and 1(d) illustrate a second step. The first step is a step for deforming a raw material in an approximately heat radiation base-like shape. As the raw material, metal such as aluminum or copper which is easily deformed, or powdered metal is effective. The second step is a step for forming fins on both sides of a sample prepared in the first step and a mold for molding the fins is provided. In this case, in order to easily mold the fins, the mold needs to have a width of a finite length at the portion indicated by X. The length is indicated as X in the view and is approximately 5 mm to 10 mm.

Figure 2:
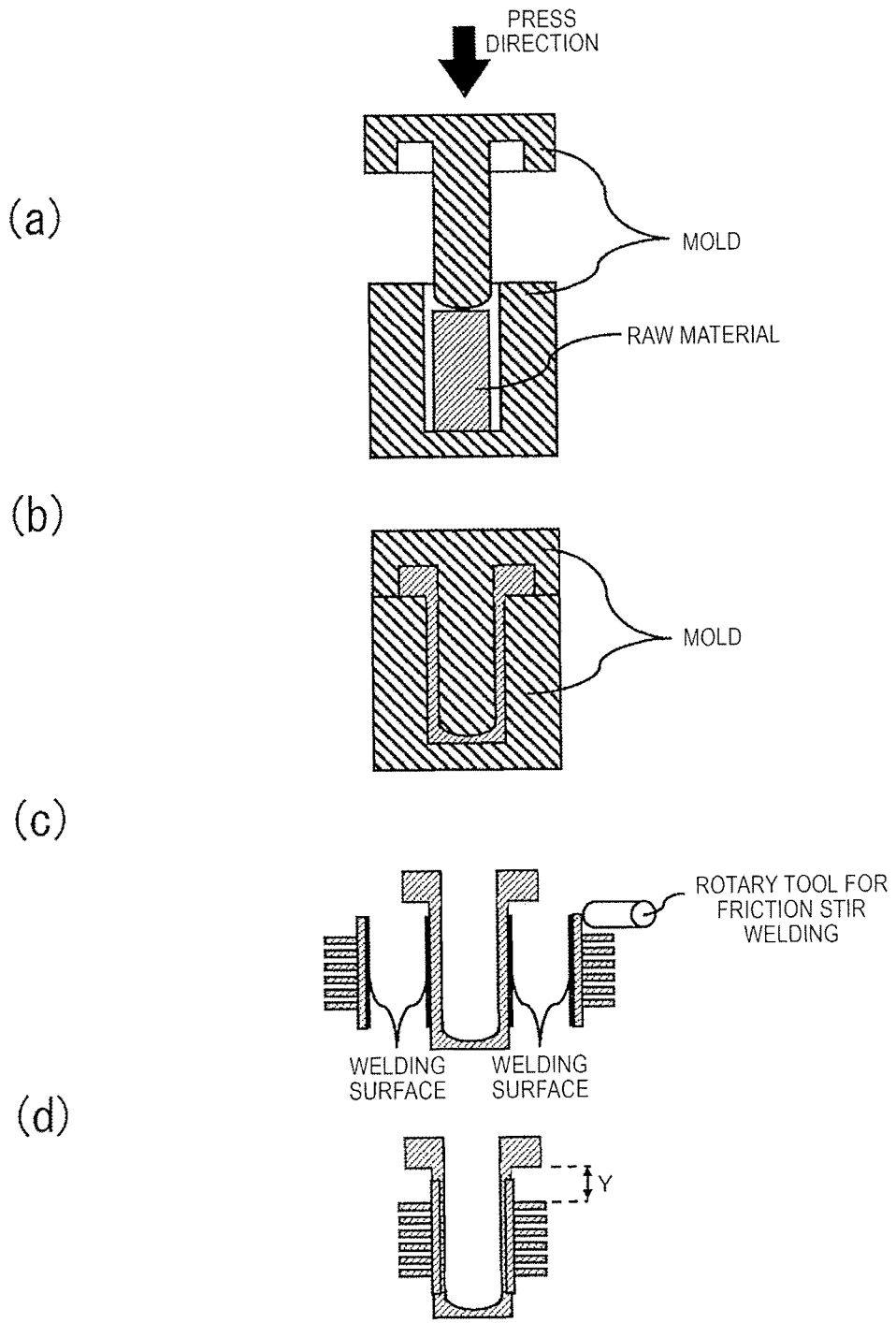
FIG. 2 illustrates a manufacturing method in which Friction Stir Welding (FSW) of the heat radiation fin section to a metal case with a flange is performed.

FIG. 2 illustrates a manufacturing method of a metal case with a fin by combination of forging and Friction Stir Welding. FIGS. 2(a) and 2(b) illustrate a first step and are the same as FIG. 1. In a second step illustrated in FIGS. 2(c) and 2(d), a technique for welding a fin section which is separately molded to the sample molded in the first step is used. For example, when using the friction stir welding technique, as illustrated in the view, in order to ensure a welding area, it is necessary that a rotary tool is used. A diameter of the rotary tool is Y in the view and, at minimum, a diameter of 10 mm is required for the rotary tool.

For the above reason, even using a manufacturing method with two forging processes or using the friction stir welding technique, it is inevitable that a gap of approximately 5 mm to 10 mm is formed between a flange section and a heat radiation fin section. Even if a forming method of a metal case is performed using cutting ignoring mass production, since a gap into which the tool enters is also required, it does not affect whether or not the gap of approximately 5 mm to 10 mm is formed between the flange section and the heat radiation fin section. Thus, in a structure in which a power semiconductor module having the heat radiation fin section and a sealing section separated from each other is inserted into an opening section of a flow path forming body, a gap is formed between a flange section and a heat radiation fin section of the power semiconductor module.

The invention is made to solve such a problem in addition to achieving the object mentioned in "Technical Problem" described above. Hereinafter, embodiments of the invention will be described with reference to the drawings.

First Example

Figure 3:
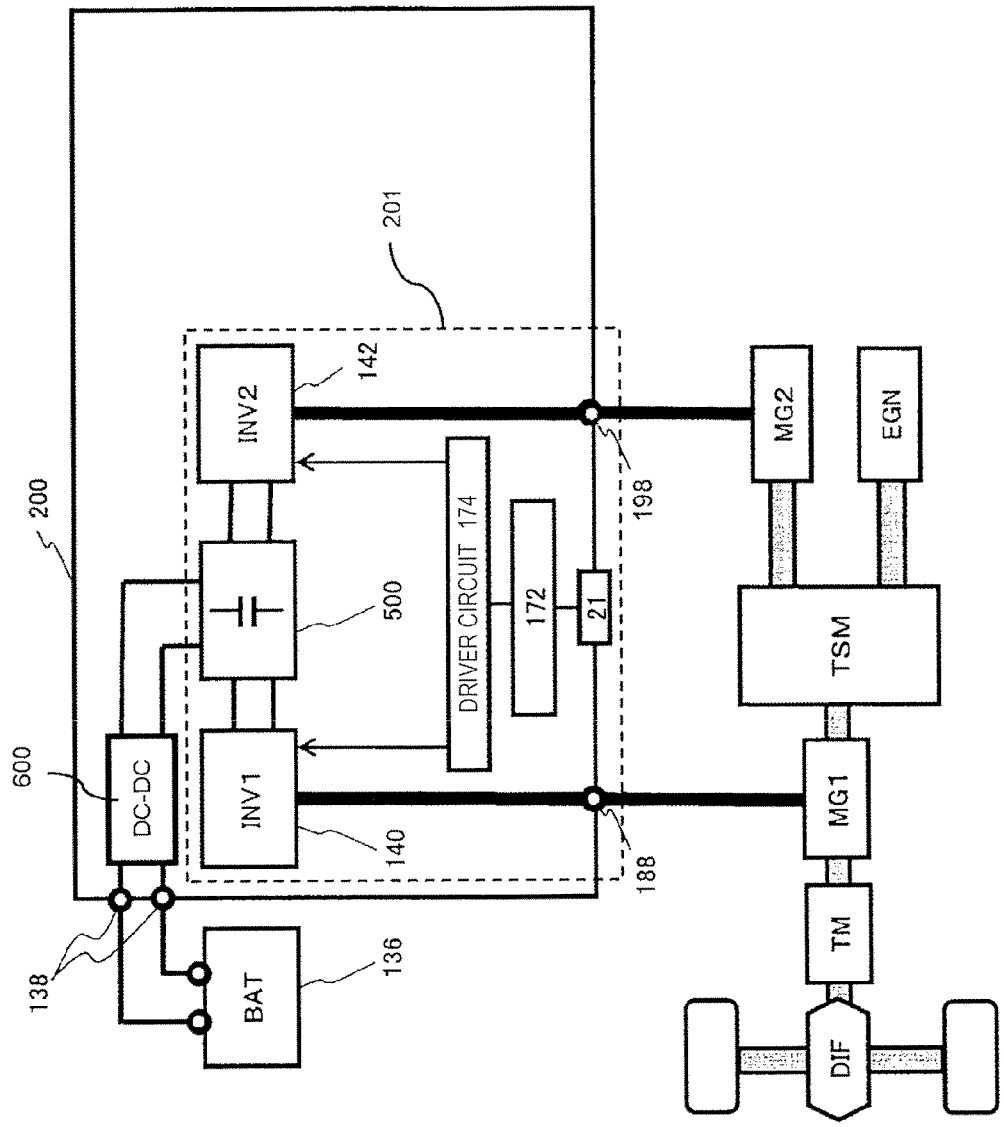
FIG. 3 is a diagram illustrating a control block of a hybrid electric vehicle.

FIG. 3 is a diagram illustrating a control block of a hybrid electric vehicle (hereinafter, described as "HEV"). An engine EGN, a motor generator MG1, and a motor generator MG2 generate a driving torque of the vehicle. Furthermore, the motor generator MG1 and the motor generator MG2 not only generate a rotary torque but also have a function for converting a mechanical energy applied from the outside to the motor generator MG1 or the motor generator MG2 into electric power.

For example, the motor generators MG1 and MG2 are synchronous motors or induction motors and, as described above, operate as motors or generators depending on an operating method. If the motor generators MG1 and MG2 are mounted on the vehicle, it is desired to obtain a high output despite a small size and a permanent magnet-type synchronous motor using a magnet such as neodymium is suitable for the motor generators MG1 and MG2. Furthermore, the permanent magnet-type synchronous motor generates less heat in a rotor compared to the induction motor and it is also excellent for the vehicle in the viewpoint of this aspect.

Output torques from the output side of the engine EGN and the motor generator MG2 are transmitted to the motor generator MG1 through a power distribution mechanism TSM. A rotary torque from the power distribution mechanism TSM or a rotary torque generated by the motor generator MG1 is transmitted to vehicle wheels through a transmission TM and a differential gear DIF. On the other hand, when operating regenerative braking, the rotary torque is transmitted from the vehicle wheels to the motor generator MG1 and AC power is generated based on a supplied rotary torque.

As described below, generated AC power is converted into DC power by a power converter 200, charges a high voltage battery 136, and charged power is used as traveling energy again. Furthermore, if power accumulated in the high voltage battery 136 is low, rotational energy generated by the engine EGN is converted into AC power by the motor generator MG2, AC power is converted into DC power by the power converter 200, and the battery 136 can be charged. Transmission of the mechanical energy from the engine EGN to the motor generator MG2 is performed by the power distribution mechanism TSM.

Next, the power converter 200 will be described. A booster circuit 600 is electrically connected to the battery 136 through a DC connector 138. A voltage of the battery 136 is boosted by the booster circuit 600. A circuit 201 after boosted has inverter circuits 140 and 142. Moreover, the power converter 200 includes a capacitor module 500 for smoothing DC power supplied to the inverter circuit 140.

If the motor generator MG1 is operated as a motor, the inverter circuit 140 generates AC power based on DC power supplied from the battery 136 through the DC connector 138 and supplies AC power to the motor generator MG1 through an AC connector 188. A configuration formed of the motor generator MG1 and the inverter circuit 140 is operated as a first electric power generating unit.

Similarly, if the motor generator MG2 is operated as the motor, the inverter circuit 142 generates AC power based on DC power supplied from the battery 136 through the DC connector 138 and supplies AC power to the motor generator MG2 through the AC connector 198. A configuration formed of the motor generator MG2 and the inverter circuit 142 is operated as a second electric power generating unit.

Both the first electric power generating unit and the second electric power generating unit may be operated as the motor or a generator, or may be separately operated depending on a driving state. Furthermore, one of both the vehicle may be stopped being not operated. Moreover, in the embodiment, the first electric power generating unit may be operated as a power generating unit by power of the battery 136 and thereby the vehicle can be driven only by power of the motor generator MG1. Furthermore, in the embodiment, it is possible to charge the battery 136 using the first electric power generating unit or the second electric power generating unit as an electric power generating unit generating power by power of an engine 120 or power from the vehicle wheels.

Furthermore, although not illustrated in FIG. 3, the battery 136 is also used as a power supply for driving a motor for an auxiliary machine. For example, the motor for the auxiliary machine is a motor for driving a compressor of an air conditioner or a motor for driving a hydraulic pump for controlling. DC power is supplied from the battery 136 to a power semiconductor module for the auxiliary machine, the power semiconductor module for the auxiliary machine generates AC power, and AC power is supplied to the motor for the auxiliary machine. The power semiconductor module for the auxiliary machine has a circuit configuration and a function that are basically similar to those of the inverter circuit 140, and controls a phase or a frequency of AC current and power supplied to the motor for the auxiliary machine.

The power converter 200 includes a communication connector 21 for receiving a command from a higher control device or for transmitting data indicating a state to the higher control device. A control circuit 172 calculates a control amount of the motor generator MG1, the motor generator MG2, or the motor for the auxiliary machine and calculates whether to be operated as the motor or to be operated as the generator based on a command from the connector 21. Then, the control circuit 172 generates a control pulse based on the calculation result and supplies the control pulse to a driver circuit 174 or a driver circuit of the module for the auxiliary machine. The driver circuit 174 generates a driving pulse for controlling the inverter circuits 140 and 142 based on the supplied control pulse.

Figure 4:
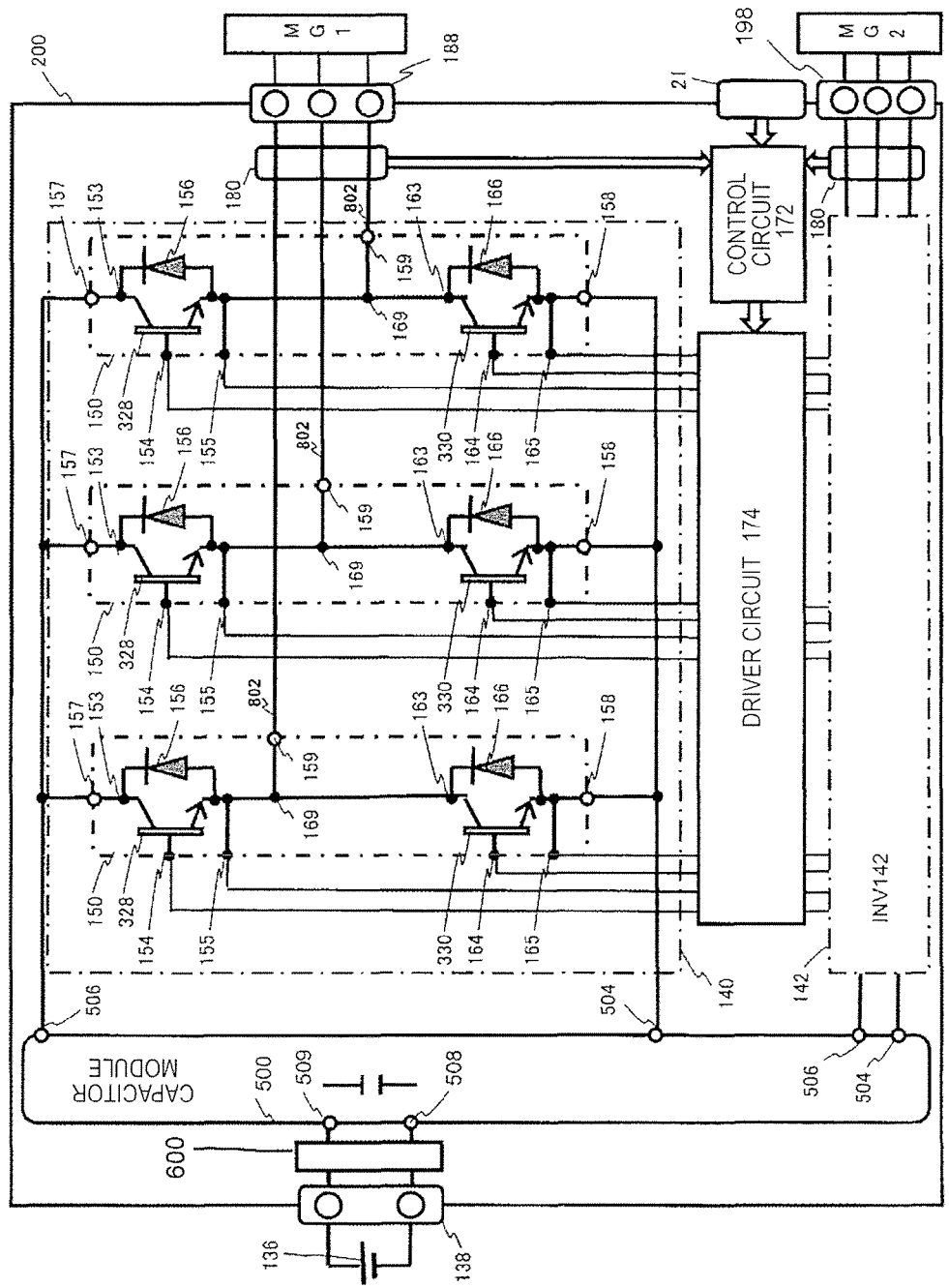
FIG. 4 is an electric circuit configuration diagram of inverter circuits 140 and 142.

FIG. 4 is an electric circuit configuration diagram of the inverter circuits 140 and 142 in the circuit 201 after boosted. Moreover, two inverter circuits 140 and 142 are extremely similar to each other in the circuit configuration and in the operation thereof, and there is a control method for operating only one motor generator MG1 as the motor or the generator. Thus, hereinafter, the inverter circuit 140 is mainly described. Furthermore, hereinafter, as a semiconductor device, an insulated gate-type bipolar transistor is used and hereinafter, the insulated gate-type bipolar transistor is referred to as IGBT for short.

An upper and lower arm series circuit 150 is configured of an upper arm IGBT 328, a diode 156, a lower arm IGBT 330, and a diode 166. The inverter circuit 140 includes the upper and lower arm series circuits 150 corresponding to three phases of a U phase, a V phase, and a W phase of AC power to be output.

In the embodiment, each of these three phases corresponds to each phase wiring of three phases of rotor wiring of the motor generator MG1. The upper and lower arm series circuits 150 of the three phases respectively output the AC current from an intermediate electrode 169 that is an intermediate point portion of a series circuit. The intermediate electrode 169 is connected to an AC bus bar 802 that is an AC power line to the motor generator MG1 through an AC terminal 159.

A collector electrode 153 of the upper arm IGBT 328 is electrically connected to a capacitor terminal 506 of a positive electrode side of the capacitor module 500 through a positive electrode terminal 157. In addition, an emitter electrode of the lower arm IGBT 330 is electrically connected to a capacitor terminal 504 of a negative electrode side of the capacitor module 500 through a negative electrode terminal 158.

As described above, the control circuit 172 receives the control command from the higher control device through the connector 21. Based on this, the control pulse, which is the control signal for controlling the IGBT 328 or the IGBT 330 configuring the upper arm or the lower arm of the upper and lower arm series circuit 150 of each phase configuring the inverter circuit 140, is generated and supplied to the driver circuit 174.

The driver circuit 174 supplies the driving pulse for controlling the IGBT 328 or the IGBT 330 configuring the upper arm or the lower arm of the upper and lower arm series circuit 150 of each phase to the IGBT 328 or the IGBT 330 of each phase based on the control pulse described above. The IGBT 328 or the IGBT 330 performs a conduction or shut-off operation and converts DC power supplied from the battery 136 into three-phase AC power based on the driving pulse from the driver circuit 174. Converted power is supplied to the motor generator MG1.

The upper arm IGBT 328 includes the collector electrode 153, a signal emitter electrode 155, and a gate electrode 154. In addition, the lower arm IGBT 330 includes a collector electrode 163, a signal emitter electrode 165, and a gate electrode 164. A diode 156 of the upper arm is electrically connected between the collector electrode 153 and the emitter electrode 155. In addition, a diode 166 is electrically connected between the collector electrode 163 and the emitter electrode 165.

As for the power semiconductor device for switching, a metal oxide semiconductor field effect transistor (hereinafter, referred to as MOSFET for short) may be used. In this case, the diode 156 or the diode 166 becomes unnecessary. As the power semiconductor device for switching, the IGBT is suitable if a DC voltage is relatively high and the MOSFET is suitable if the DC voltage is relatively low.

The capacitor module 500 includes a plurality of positive electrode-side capacitor terminals 506, a plurality of negative electrode-side capacitor terminals 504, a positive electrode-side power supply terminal 509, and a negative electrode-side power supply terminal 508. DC power of a high voltage from the battery 136 is supplied to the positive electrode-side power supply terminal 509 or the negative electrode-side power supply terminal 508 through the DC connector 138 and is supplied from the positive electrode-side capacitor terminal 506 and the negative electrode-side capacitor terminal 504 of the capacitor module 500 to the inverter circuit 140.

On the other hand, DC power converted from AC power by the inverter circuit 140 or the inverter circuit 142 is supplied from the positive electrode-side capacitor terminal 506 or the negative electrode-side capacitor terminal 504 to the capacitor module 500, is supplied from the positive electrode-side power supply terminal 509 or the negative electrode-side power supply terminal 508 to the battery 136 through the DC connector 138, and is accumulated in the battery 136.

The control circuit 172 includes a microcomputer for a calculating process of switching timing of the IGBT 328 and the IGBT 330. Input information into the microcomputer includes a target torque value required for the motor generator MG1, a current value supplied from the upper and lower arm series circuit 150 to the motor generator MG1, and a magnetic pole position of the rotor of the motor generator MG1.

The target torque value is based on the command signal output from the higher control device (not illustrated). The current value is detected based on a detection signal from a current sensor 180. The magnetic pole position is detected based on a detection signal output from a rotating magnetic pole sensor (not illustrated) such as a resolver provided in the motor generator MG1. In the embodiment, a case where the current sensor 180 detects three-phase current values is exemplified, but current values of two-phase may be detected and the three-phase current values may be obtained by calculation.

Current command values of a d shaft and a q shaft of the motor generator MG1 are calculated by the microcomputer in the control circuit 172 based on the target torque value. Then, the microcomputer described above calculates voltage command values of the d shaft and the q shaft based on a difference between the calculated current command values of the d shaft and the q shaft and detected current values of the d shaft and the q shaft. Then, the microcomputer described above converts the calculated voltage command values of the d shaft and the q shaft into the voltage command values of the U phase, the V phase, and the W phase based on the detected magnetic pole position. Then, the microcomputer described above generates a pulse-shaped modulation wave based on a comparison between a basic wave (sine wave) and a carrier wave (triangular wave) based on the voltage command values of the U phase, the V phase, and the W phase. Then, the microcomputer described above outputs the generated modulation wave to the driver circuit 174 as a pulse width modulation (PWM) signal.

When driving the lower arm, the driver circuit 174 outputs the driving signal that is obtained by amplifying the PWM signal to the corresponding gate electrode of the IGBT 330 of the lower arm. In addition, when driving the upper arm, the driver circuit 174 shifts a level of a reference potential of the PWM signal to a level of a reference potential of the upper arm, amplifies the PWM signal, and outputs the PWM signal to the corresponding gate electrode of the IGBT 328 of the upper arm as the driving signal.

In addition, the microcomputer inside the control circuit 172 performs abnormality detection (over-current, over-voltage, over-temperature, and the like) and protects the upper and lower arm series circuit 150. Thus, sensing information is input into the control circuit 172. For example, information of the current flowing through the emitter electrode of each of the IGBT 328 and the IGBT 330 is input from the signal emitter electrode 155 and the signal emitter electrode 165 of each arm into corresponding driving section (IC). Thus, each driving section (IC) performs detection of the over-current, and if the over-current is detected, stops a switching operation of the corresponding IGBT 328 and the IGBT 330, and protects the corresponding IGBT 328 and the IGBT 330 from the over-current.

The temperature information of the upper and lower arm series circuit 150 from a temperature sensor (not illustrated) provided in the upper and lower arm series circuit 150 is input into the microcomputer. Furthermore, voltage information on the DC current positive electrode side of the upper and lower arm series circuit 150 is input into the microcomputer. The microcomputer performs over-temperature detection and over-voltage detection based on the information and stops a switching operation of both the IGBT 328 and the IGBT 330 if over-temperature or over-voltage is detected.

Hereinafter, a schematic configuration of the power converter 200 in the embodiment will be described with reference to FIGS. 5 to 9.

Figure 5:
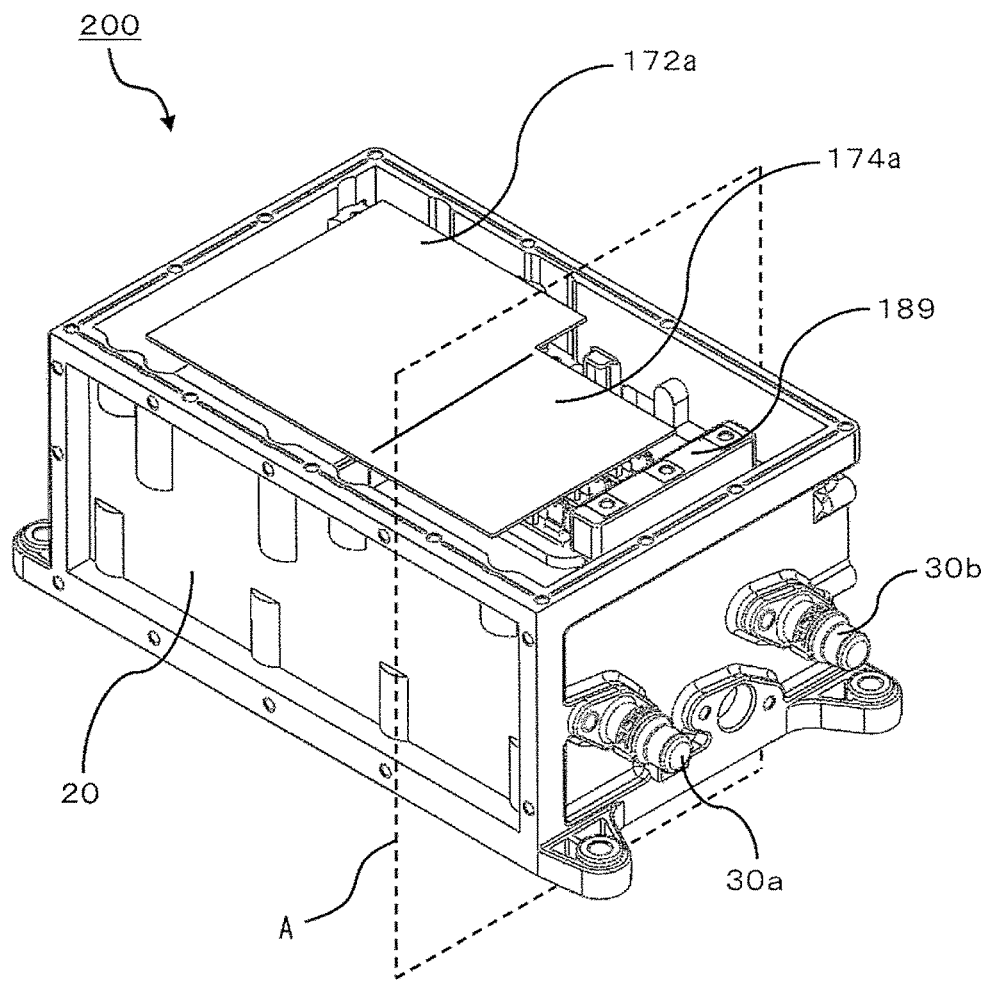
FIG. 5 is a perspective view of a power converter 200 of a first example.

FIG. 5 is a perspective view of the power converter 200 of the embodiment. FIG. 5 is a perspective view of a state where a casing upper lid (not illustrated) is removed. The power converter 200 includes a casing 20 for housing the configuration members of the power converter 200 illustrated in FIGS. 3 and 4. A driver circuit substrate 174a and a control circuit substrate 172a of the configuration members housed in the casing 20 are disposed on an upper side within the casing 20. The driver circuit 174 described above is mounted on the driver circuit substrate 174a. The control circuit 172 described above is mounted on the control circuit substrate 172a.

The casing 20 is provided with an inlet pipe 30a for introducing a cooling refrigerant into the casing 20 and an outlet pipe 30b for discharging the cooling refrigerant.

In the power converter 200 of the embodiment, an example in which only one motor generator MG1 is operated as the motor or the generator, that is, an example in which only one inverter circuit 140 is provided is described, but as illustrated in FIGS. 3 and 4, it is also possible to append the inverter circuit 142. This structure has a substantially rectangular shape in a plan view, thereby having an effect that attachment thereof to the vehicle or the motor generator can be easily performed. Furthermore, since all members from a casing lower lid 22 to the casing upper lid (not illustrated) can be stacked, there is an effect of easy production.

Figure 6:
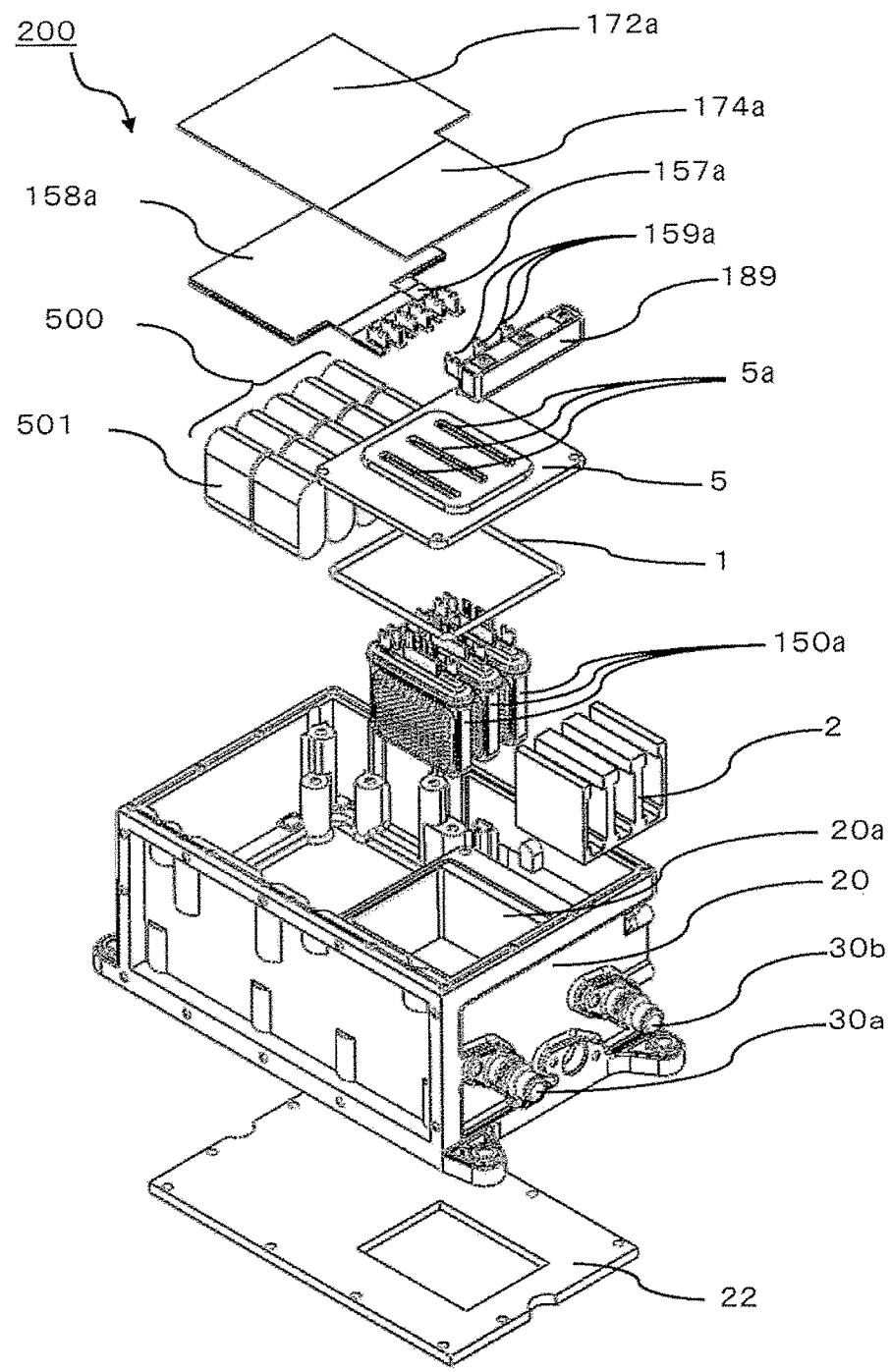
FIG. 6 is an exploded perspective view of the power converter 200 of the first example.

FIG. 6 is an exploded perspective view of the power converter 200 of the embodiment. A power semiconductor module 150a and the capacitor module 500 configuring the inverter circuit 140 of FIG. 4 are housed within the casing 20. The power semiconductor module 150a used in the power converter 200 of the embodiment is a power semiconductor module of a two-in-one type having switching elements of the upper and lower arms.

A module housing space 20a is formed in the casing 20. The power semiconductor module 150a described above is housed in the module housing space 20a. In this case, a flow path forming member 2 interposing the power semiconductor module 150a is also housed in the module housing space 20a. The flow path forming member 2 is configured of a first side wall section facing the power semiconductor module 150a, a second side wall section facing the first side wall section with the power semiconductor module 150a interposed therebetween, and a bottom surface section straddling a bottom surface of the power semiconductor module 150a and connecting the first side wall section and the second side wall section.

Furthermore, in the embodiment, in order to simplify the flow path, the module housing space 20a has one opening section. The flow path forming member 2 of the embodiment has a structure holding three power semiconductor modules 150a.

The flow path forming member 2 is housed in the module housing space 20a and forms a flow path together with the casing 20 through which the cooling refrigerant flows. That is, the flow path forming member 2 functions as a first flow path forming body and the casing 20 functions as a second flow path forming body. The casing 20 functions as a flow path forming body and, also functions as a structural member holding a member configuring the power converter 200.

In the embodiment, the flow path forming member 2 for forming a flow path around only a periphery of the power semiconductor module is mounted on the power semiconductor module 150a in the same direction as a refrigerant traveling direction in advance and then the flow path forming member 2 and the three power semiconductor modules 150a are inserted into the module housing space 20a together.

The module housing space 20a of the casing 20 is closed by a cover 5. A sealing material 1 is disposed between the cover 5 and the module housing space 20a. The cover 5 is provided with an opening section 5a through which wiring of the power semiconductor module 150a passes.

An AC terminal stand 189 holding an output-side AC bus bar 159a is provided above the cover 5. As described below, a power semiconductor module-side AC terminal 159b (see FIG. 8(a)) of the power semiconductor module 150a is connected to the output-side AC bus bar 159a. In addition, a positive electrode terminal 157b (see FIG. 8(a)) of the power semiconductor module 150a is connected to a capacitor-side positive electrode bus bar 157a. A negative electrode terminal 158b (see FIG. 8 (a)) of the power semiconductor module 150a is connected to a capacitor-side negative electrode bus bar 158a.

Furthermore, the capacitor module 500 configured of a plurality of capacitor cells 501 is disposed in the casing 20.

Figure 7:
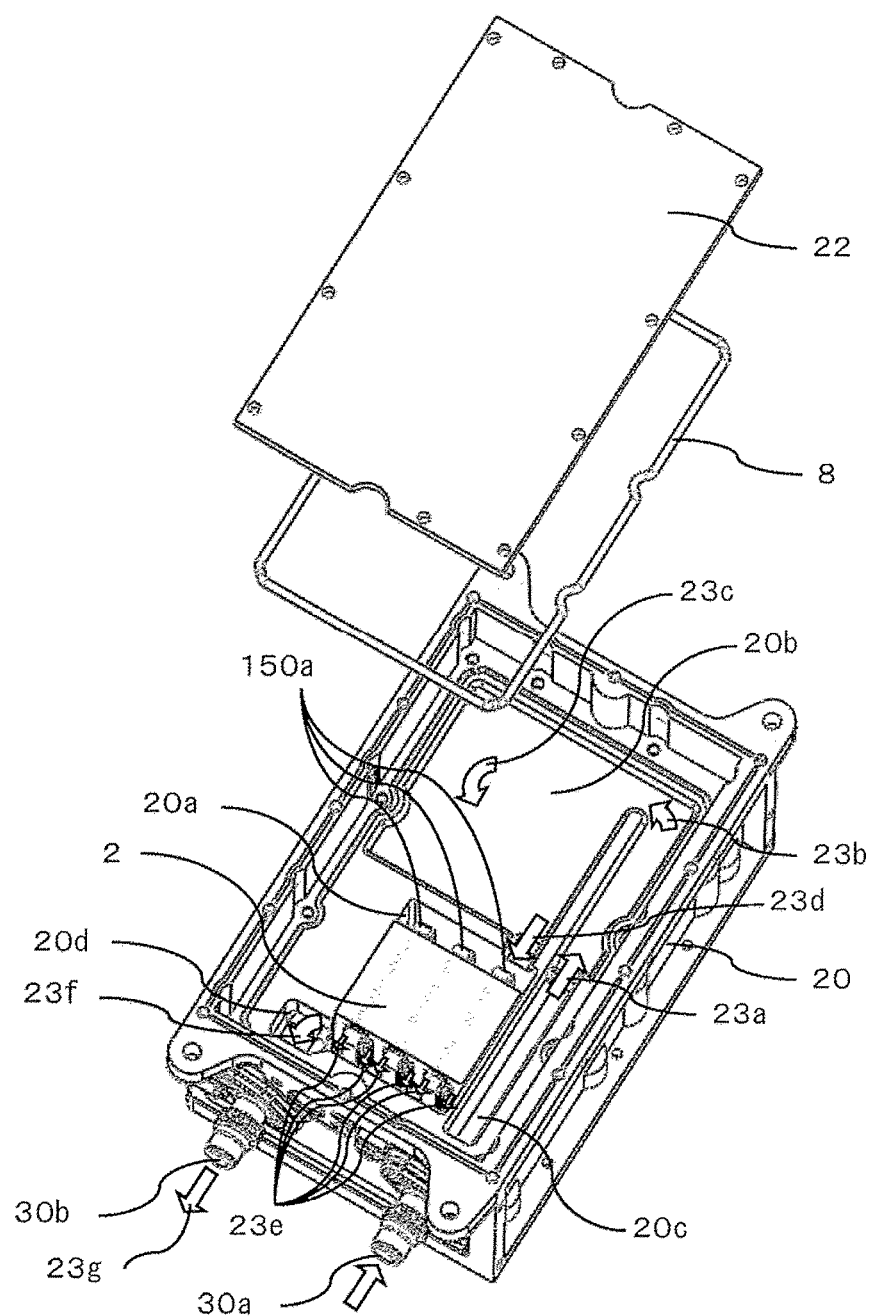
FIG. 7 is an exploded perspective view of the power converter 200 of the first example viewed from below.

FIG. 7 is an exploded perspective view of the power converter 200 of the embodiment viewed from below. A lower surface of the power converter 200 is closed by the lower lid 22. A sealing material 8 is provided between the lower lid 22 and the casing 20.

The casing 20 is provided with the module housing space 20a for housing the power semiconductor module 150a and the flow path forming member 2, a capacitor module lower flow path 20b, an inlet flow path 20c, and an outlet flow path 20d. The inlet flow path 20c is connected to the inlet pipe 30a. The capacitor module lower flow path 20b is connected to the inlet flow path 20c. The module housing space 20a is connected to the capacitor module lower flow path 20b. The outlet flow path 20d is connected to the module housing space 20a. The outlet pipe 30b is connected to the outlet flow path 20d. The module housing space 20a houses the power semiconductor module 150a and the flow path forming member 2, and also functions as a flow path through which the refrigerant flows.

The refrigerant is introduced from the inlet pipe 30a and flows in a turn section refrigerant traveling direction 23b, a capacitor module lower refrigerant traveling direction 23c, a refrigerant traveling direction before branching and passing through the power semiconductor module 23d, a refrigerant traveling direction immediately after branching and passing through the power semiconductor module 23e, a refrigerant traveling direction after joining and passing through the power semiconductor module 23f, and an outlet-side refrigerant traveling direction 23g in this order from an inlet-side refrigerant traveling direction 23a.

The flow path formed by the flow path forming member 2 is configured such that flow paths on both surface sides of the power semiconductor module 150a are arranged in parallel. In the embodiment, since flow paths arranged in parallel in three modules, six flow paths are arranged in parallel. Moreover, the refrigerant flows through a lower portion of the capacitor module 500 through the casing and the capacitor module is also cooled.

Figure 8A:
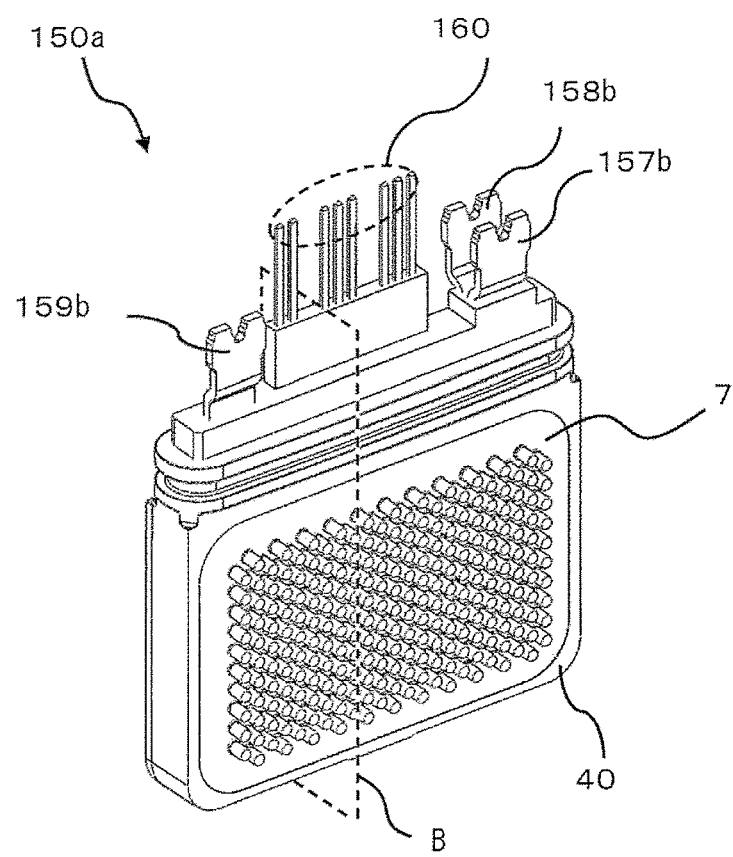
FIG. 8(a) is a perspective view of a power semiconductor module.
Figure 8B:
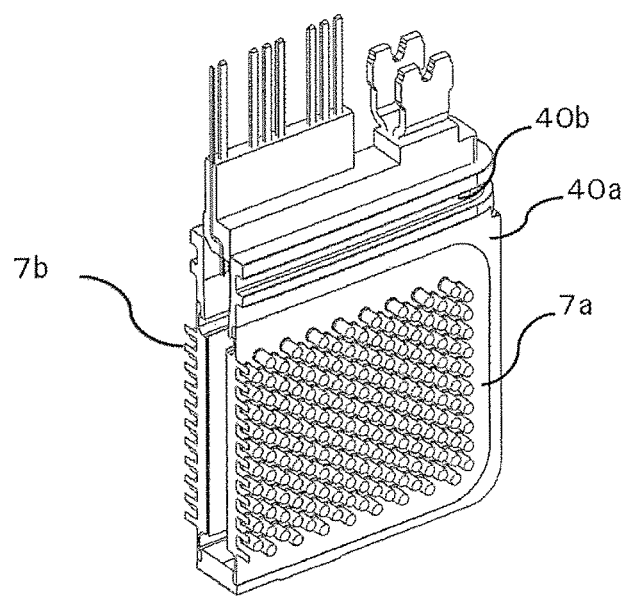
FIG. 8(b) is a sectional view that is cut by a cross section B of FIG. 8(a).

FIG. 8 (a) is a perspective view of the power semiconductor module 150a of the embodiment. FIG. 8(b) is a sectional view cut by a cross section B of FIG. 8(a).

Each of the power semiconductor modules 150a is provided with heat radiation section 7 that are metal-welded to both surfaces of a metal case 40.

The power semiconductor module 150a houses the upper and lower arm series circuit 150 described above in the metal case 40 and is transfer-molded through an insulating layer. The metal case 40 can be an integral-type container obtained by performing can-shaped molding and performing casting of the heat radiation fin section 7 and a casing section 40a in order to reduce costs.

The power semiconductor module 150a has the power semiconductor module-side positive electrode terminal 157b, the power semiconductor module-side negative electrode terminal 158b, and the power semiconductor module-side AC terminal 159b, a control pin•signal pin•temperature output pin, and the like 160. The power semiconductor module-side positive electrode terminal 157b is connected to the capacitor-side positive electrode bus bar 157a and configures the positive electrode terminal 157 of FIG. 4. The power semiconductor module-side negative electrode terminal 158b is connected to the capacitor-side positive electrode bus bar 158a and configures the negative electrode terminal 158 of FIG. 4. The power semiconductor module-side AC terminal 159b is connected to the output-side AC bus bar 159a and configures the AC terminal 159 of FIG. 4. The control pin•signal pin•temperature output pin, and the like 160 are connected to the control circuit substrate 172 through the driver circuit substrate 174a and exchanges information of a gate signal, an emitter sensing signal, or a temperature sensor built-in to power semiconductor.

Furthermore, the metal case 40 has the portion 40a holding the heat radiation section 7 and a portion 40b coming into contact with the sealing material on the side. If a sealing material such as an O-ring is used, grooving for the O-ring is performed in the portion 40b coming into contact with the sealing material and the portion 40b has a curved surface so as not to damage the O-ring. Thus, it is possible to realize high effective sealing properties by providing a cover opening section 5a having a concave section in the cover 5 and by using a sealing material 6 (see FIG. 9) between the module and the cover.

A first heat radiation section 7a is formed on one surface of the power semiconductor module 150a and a second heat radiation section 7b is formed on the other surface. Heat radiation fins are formed in a region facing the power semiconductor device to increase heat radiation properties. In the embodiment, a fin shape of the heat radiation section 7 is a pin fin, but may be another shape such as a straight fin or a corrugated fin.

Figure 9A:
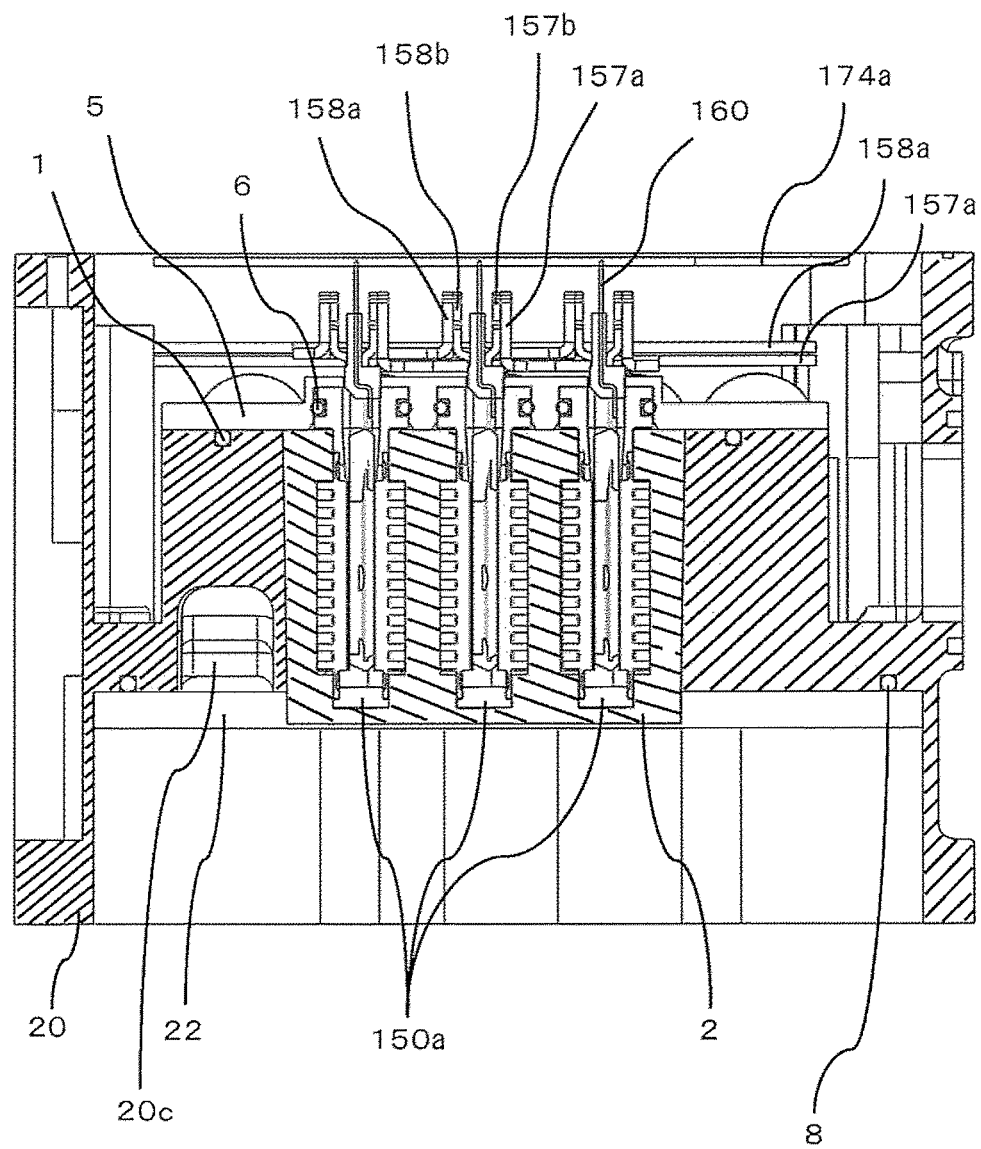
FIG. 9(a) is a sectional view that is cut by a cross section A of FIG. 5.
Figure 9B:
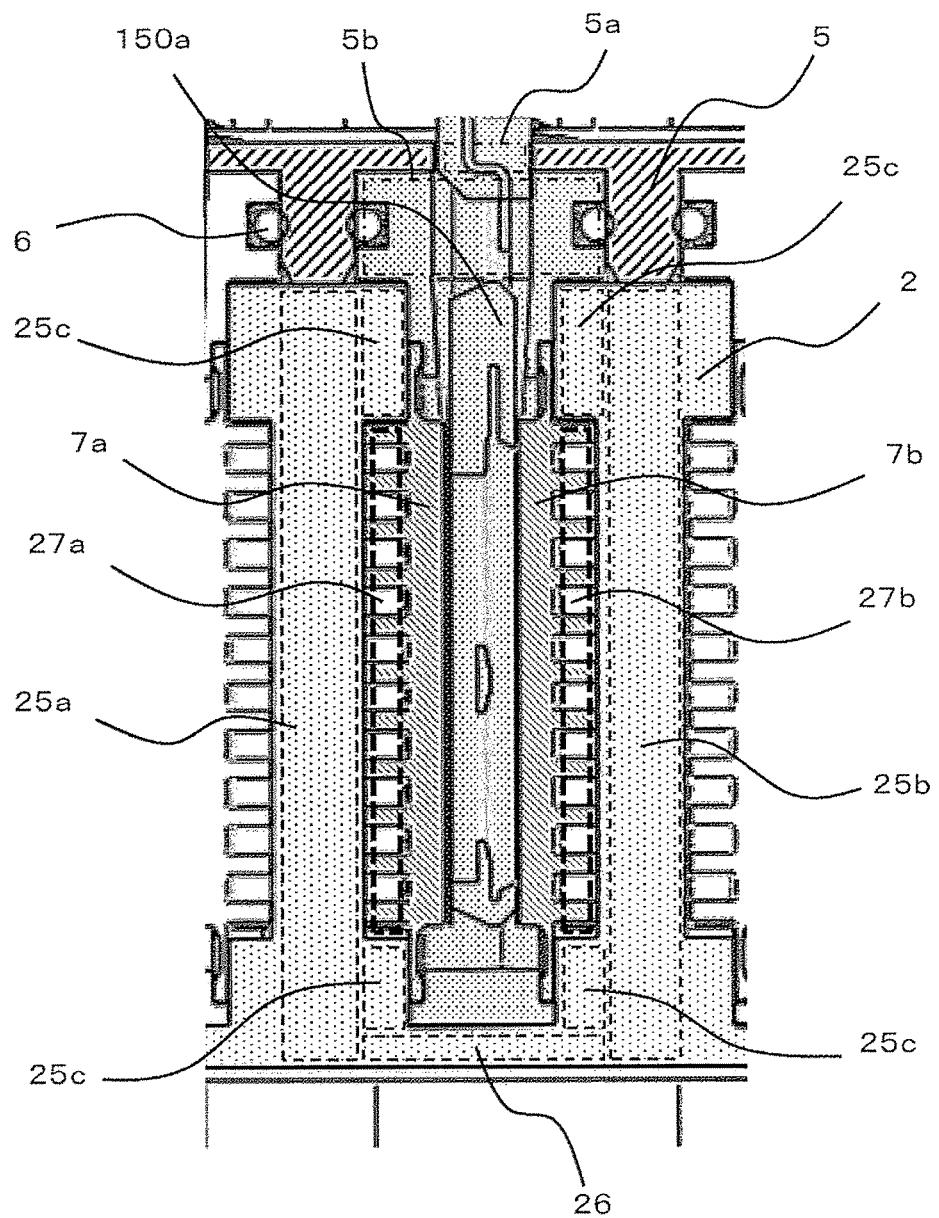
FIG. 9(b) is a partial enlarged view of FIG. 9(a).

FIG. 9(a) is a sectional view that is cut by a cross section A of FIG. 5. The power semiconductor module 150a is disposed so as to be surrounded by the flow path forming member 2 and the flow path forming member 2 is housed in the module housing space 20a formed in the casing 20. The lower lid 22 is disposed in a lower portion of the casing 20 through the sealing material 8. The cover 5 is disposed in the upper portion of the casing 20 through the sealing material 1.

The capacitor-side positive electrode bus bar 157a and the capacitor-side negative electrode bus bar 158a are disposed above the cover 5. In addition, the driver circuit substrate 174a is disposed further above the capacitor-side positive electrode bus bar 157a and the capacitor-side negative electrode bus bar 158a, and is connected to the control pin•signal pin•temperature output pin, and the like 160.

FIG. 9 (b) is an enlarged view of FIG. 9(a) for describing a dispositional relationship between the power semiconductor module 150a, the flow path forming member 2, and the cover 5.

The cover 5 is provided with a concave section 5b that is formed on the module housing space 20a side and the opening section 5a that passes from a bottom surface of the concave section 5b to the upper surface of the cover 5.

The power semiconductor module 150a is formed such that the flange section from which the terminals (157b, 158b, 159b, and 160) of the power semiconductor modules 150a protrude is disposed within the concave section 5b. The sealing material 6 is disposed in the portion 40b coming into contact with the sealing material on the side surface of the power semiconductor module 150a. The terminal of the power semiconductor module 150a protrudes from the opening section 5a to the outside of the module housing space 20a.

The flow path forming member 2 has a first side wall section 25a, a second side wall section 25b, and a bottom surface section 26. The first side wall section 25a is formed to face the first heat radiation section 7a of the power semiconductor module 150a. The second side wall section 25b is formed to face the second heat radiation section 7b of the power semiconductor module 150a. A bottom surface section 26 is formed so as to straddle a bottom surface of the power semiconductor module 150a and to connect the first side wall section 7a and the second side wall section 7b.

A first heat radiation section-side flow path 27a is formed between the first side wall section 25a and the first heat radiation section 7a of the power semiconductor module 150a. A second heat radiation section-side flow path 27b is formed between the second side wall section 25b and the second heat radiation section 7b of the power semiconductor module 150a.

The first side wall section 25a and the second side wall section 25b have convex sections 25c. The convex sections 25c are formed in regions in which the heat radiation fins illustrated in FIG. 1 or 2 are not formed. Thus, the refrigerant efficiently flows through a heat radiation fin forming region. In this regard, the convex section 25c is formed on a side portion of the first heat radiation section-side flow path 27a in which the heat radiation fins are formed on the first side wall section 25a side. The side portion referred to here indicates a portion adjacent to the first heat radiation section-side flow path 27a in a direction perpendicular to a direction in which cooling refrigerant flows, the perpendicular direction being parallel to a main surface of the power semiconductor module 150a. In other words, the power semiconductor module 150a is disposed to face the convex section 25c formed in the first side wall section 25a and the first heat radiation section-side flow path 27a so as to straddle the convex section 25c formed in the first side wall section 25a and the first heat radiation section-side flow path 27a.

The convex section 25c is formed between the first heat radiation section-side flow path 27a in which the heat radiation fins are formed and the flange section of the power semiconductor module 150a. Furthermore, in the example, the convex section 25c is also formed between the first heat radiation section-side flow path 27a and the bottom surface section 26. Furthermore, the convex section 25c is also formed between the second side wall section 25b and the power semiconductor module 150a similar to that on the first side wall section 25a side.

The bottom surface section 26 of the flow path forming member 2 is formed so as to come into contact with a bottom surface of the power semiconductor module 150a. Thus, since the power semiconductor module 150a has a structure that is held by the cover 5 and the flow path forming member 2, a vibration resistance is improved.

As a material configuring the flow path forming member 2, an elastic body is preferably used. The elastic body is a material having a heat resistance (−40° C. to 100° C.) and a chemical resistance (not dissolvable in the refrigerant (ethylene glycol solution or propylene glycol solution)). For example, the material of the elastic body is rubber, a foam (sponge) member, a material that thermally expands at high temperature, and a material that expands by reacting with the liquid. Specifically, the rubber is preferably silicon/Ethylene Propylene Diene Monomer (EPDM)/butyl-based rubber. Specifically, the foam (sponge) member is preferably polyethylene/urethane/EPDM/butyl rubber/silicon having the heat resistance. The material expanding by reacting with the liquid is chloroprene rubber and the like.

If the flow path forming member 2 is formed of the sponge member, it is possible to fill the gap between the power semiconductor modules by cutting sealing and being mixed with air when mounting the sponge member of a vacuum package. Similarly, if the flow path forming member 2 is formed of the material thermally expanding at high temperature and the material expanding by reacting with the liquid, it is possible to fill the gap by expanding the material after mounting.

As described above, the power converter 200 of the embodiment includes the casing 20 that houses parts and functions as a flow path forming body, and the casing 20 forms the module housing space 20a that houses the power semiconductor module 150a. The power semiconductor module 150a housed in the module housing space 20a is disposed so as to be surrounded by the flow path forming member 2 that is the second flow path forming body. The forming member 2 forms the first heat radiation section-side flow path 27a between the flow path forming member 2 and one surface of the power semiconductor module 150a, and the flow path forming member 2 forms the second heat radiation section-side flow path 27b between the flow path forming member 2 and the other surface of the power semiconductor module 150a.

As described above, the refrigerant flowing to cool the power semiconductor module 150a flows through the module housing space 20a formed in the casing 20 and flows through the first heat radiation section-side flow path 27a and the second heat radiation section-side flow path 27b formed by the flow path forming member 2 that is the second flow path forming body. It is possible to fill the gap generated between the power semiconductor module 150a and the module housing space 20a with the flow path forming member 2. Thus, since the refrigerant does not flow via the gap, cooling performance of the power semiconductor module is improved.

Then, the flow path forming member 2 has the convex section 25c formed in the side portion of the refrigerant flow path as described above. Thus, since a refrigerant amount flowing through the heat radiation fin forming region facing the power semiconductor device that needs to be cooled preferentially increases, the cooling performance of the power semiconductor module is improved.

Then, the cover 5 covering the module housing space 20a is provided with the concave section 5b. A part of the power semiconductor module 150a is disposed on the inside of the concave section 5b and the power semiconductor module 150a is sealed by the sealing material 6 on the inside of the concave section 5b. In such a side surface sealing method, for example, if the cover 5 is bolted to the casing 20, the sealing material 6 is collapsed in the side surface regardless of a pressing force of the bolts. Thus, the bolts are not necessary to be provided in the flow path around the power semiconductor module 150a and there is an effect that the number of bolts is reduced.

Furthermore, even if the dimensions in the vertical direction are reduced by manufacturing variation of the power semiconductor module or assembling variation, since the sealing material 6 is always collapsed in the side surface, it is possible to prevent the liquid from leaking to the outside.

Here, sealing in the side surface of the thick plate is prevented by providing the concave section in the cover 5. If the thick plate is used, since weight reduction is difficult and the center of gravity is high, there is also a problem in the resistance to seismic activity of the structure. It is possible to maintain rigidity of only where it is required and to reduce the weight by providing the concave section.

As in the embodiment, the concave section 5b exhibits a positioning operation when inserting the power semiconductor module 150a if the concave section 5b is provided in the cover 5 having the opening section 5a into which the terminal of the power semiconductor module 150a is inserted. Furthermore, the power semiconductor module 150a is fixed not only in the vertical direction but also in the horizontal direction and it is possible to improve the vibration resistance and reliability by disposing the flange section of the power semiconductor module 150a on the inside of the concave section 5b.

Then, if the flow path forming member 2 is formed of the elastic body, even if the manufacturing variation occurs when manufacturing the power semiconductor module, the variation is absorbed and it is possible to fill the gap between the flow path forming member 2 and the power semiconductor module. Thus, it is possible to suppress generation of a local space bypass flow on the inside thereof and to improve the cooling performance. Furthermore, the variation of the cooling performance of the power semiconductor module can be suppressed, which contributes to the improvement of the cooling performance.

In addition, in a metal connection portion between a signal pin 160 and the control circuit substrate 172 or a portion in which the positive electrode terminal 157b, the negative electrode terminal 158b, and the AC terminal 159b described above are metallically welded, there is a need to ensure that connection failure due to vibration which is potentially caused by the vehicle does not occur. In the side surface sealing method of the embodiment, it is possible to improve the vibration resistance by covering the power semiconductor module with the flow path forming member 2 formed of the elastic body.

The driver circuit substrate 174a and the control circuit substrate 172a are thermally connected to the metal casing 20 and heat is dissipated to the cooling refrigerant on the inside of the flow path through the metal member having high thermal conductivity. Furthermore, as illustrated in FIGS. 5 and 6, the driver circuit substrate 174a and the control circuit substrate 172a can be integrally formed.

The control circuit substrate 172a is provided with a connector (not illustrated). The connector is connected to an external control device and performs signal transmission between the control circuit 172 provided in the control circuit substrate 172a and the external control device such as a higher control device.

Moreover, since the capacitor-side positive electrode bus bar 157a and the capacitor-side negative electrode bus bar 158a are heated if a large current flows, it is necessary to prevent heat from entering the power semiconductor module 150a. Then, it is possible to suppress the heat from entering the power semiconductor module 150a by causing the bus bar to come into thermal contact with the cover 5 for fixing the power semiconductor module. If the cover 5 is a metal material, the bus bar comes into thermal contact with the cover 5 through an insulating layer, but the material of the cover may be an insulating material such as resin.

Furthermore, in the embodiment described above, the power converter for the vehicle mounted on the electric vehicle or the hybrid electric vehicle is described as an example, but it is possible to apply the invention to a power converter if the power converter has a cooling structure in which the power semiconductor module is immerged in the cooling refrigerant.

Second Example

Figure 10:
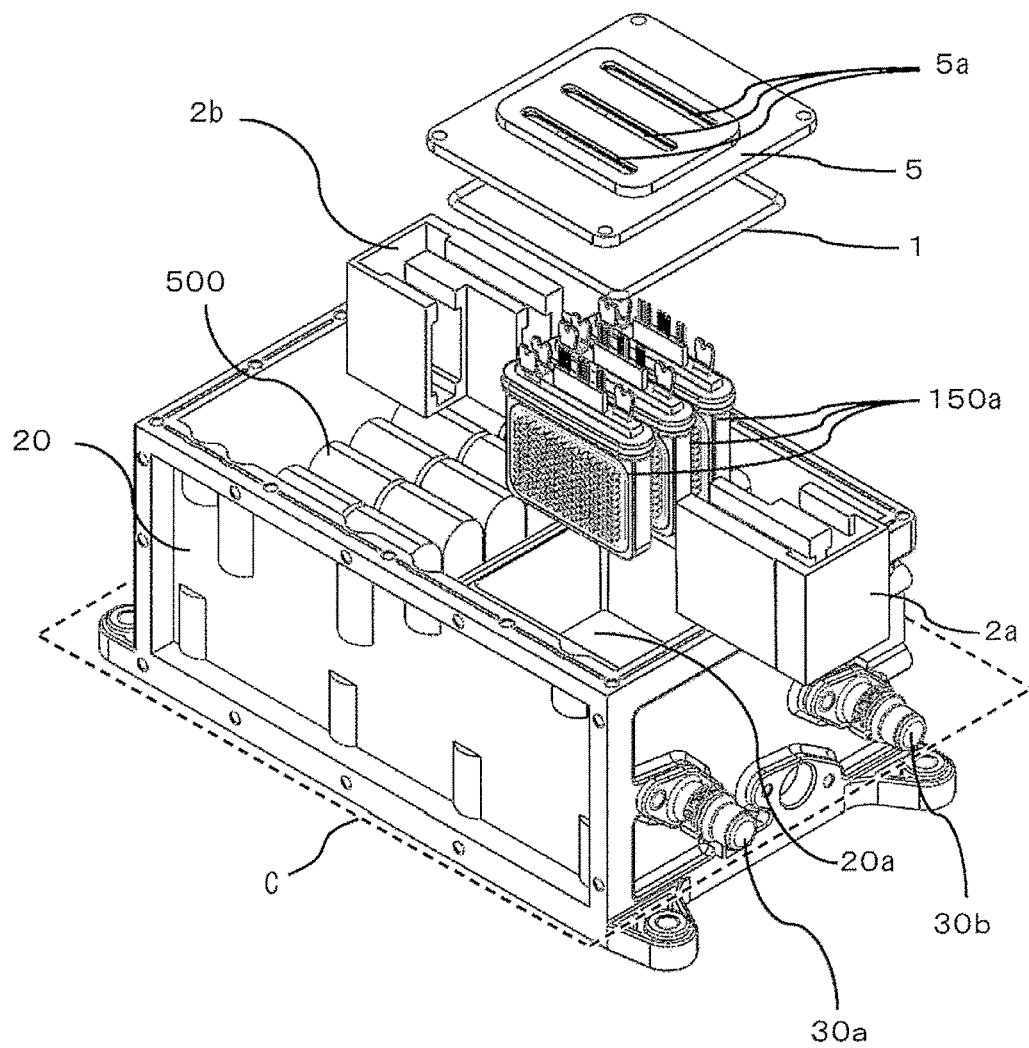
FIG. 10 is a perspective view of a power converter 200 of a second example.

A schematic configuration of a power converter 200 of a second example will be described with reference to FIGS. 10 and 11. FIG. 10 illustrates a modification example in which the flow path forming member 2 of the first example is changed to a first flow path forming member 2a and a second flow path forming member 2b. Since the other configurations are the same as the configurations of the first example, detailed description will be omitted.

The first flow path forming member 2a is mounted on a power semiconductor module 150a from the same direction as a refrigerant traveling direction similar to when the flow path forming member 2 is mounted on the power semiconductor module 150a in the first example. Here, in the first example, the flow path forming member 2 is mounted so as to hold all of three power semiconductor modules 150a, but in this embodiment, two adjacent power semiconductor modules 150a among three power semiconductor modules 150a are mounted on the first flow path forming member 2a.

A power semiconductor module 150a disposed between the other two power semiconductor modules 150a among the three power semiconductor modules 150a is configured such that the first flow path forming member 2a is mounted to the center of the power semiconductor module 150a. Then, the second flow path forming member 2b is disposed so as to have point symmetry with the first flow path forming member 2a with respect to the center of the power semiconductor module 150a.

Figure 11:
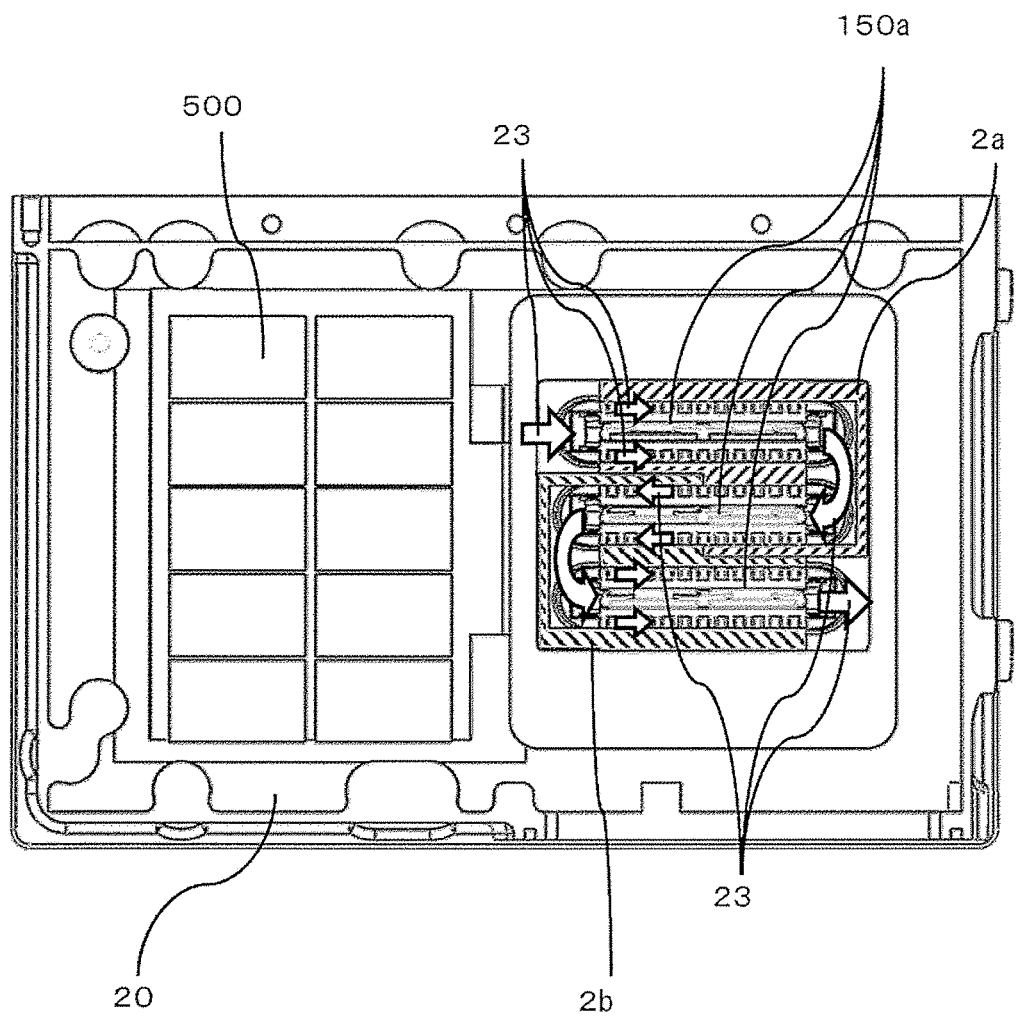
FIG. 11 is a sectional view that is cut by a cross section C of FIG. 10 when viewed from below.

FIG. 11 is a sectional view that is cut by a cross section C of FIG. 10 when viewed from below. One power semiconductor module 150a among the three power semiconductor modules 150a is held by the first flow path forming member 2a. The power semiconductor module 150a disposed between the other two power semiconductor modules 150a among the three power semiconductor modules 150a is held by the first flow path forming member 2a and the second flow path forming member 2b. One remaining power semiconductor module 150a among the three power semiconductor modules 150a is held by the second flow path forming member 2b.

The first flow path forming member 2a forms a connection flow path that connects two flow paths formed in a side portion of a first power semiconductor module 150a and two flow paths formed in a side portion of a second power semiconductor module 150a. Similarly, the second flow path forming member 2b also forms a connection flow path that connects two flow paths formed in a side portion of a second power semiconductor module 150a and two flow paths formed in a side portion of a third power semiconductor module 150a.

In the first example, the refrigerant flowing to the three power semiconductor modules 150a flows through the flow paths branched into six in parallel, but in this example, the refrigerant flowing through the flow path flows through the flow path branched into two. In other words, in the first example, the three power semiconductor modules 150a are cooled in parallel, but in this embodiment, the three power semiconductor modules 150a are cooled in series.

For a refrigerant circulation system handling a large pump that can tolerate significant pressure loss, when the number of branching flow paths is reduced, a flow rate of the refrigerant for one module is increased. As a result, since a heat transfer coefficient is increased, it is possible to improve the cooling performance.

In the embodiment, it is possible to control the cooling performance only by changing the flow path forming member 2 of the first example to the first flow path forming member 2a and the second flow path forming member 2b which are separated from each other. Thus, there is an effect that it is not time-consuming to design change entire members of the power converter.

Furthermore, the flow path around the power semiconductor module in which processing control becomes complicated is formed by the elastic body and thereby it is possible to suppress an increase in machining costs.

Third Example

A schematic configuration of a power converter 200 of a third example will be described with reference to FIG. 12.

Figure 12:
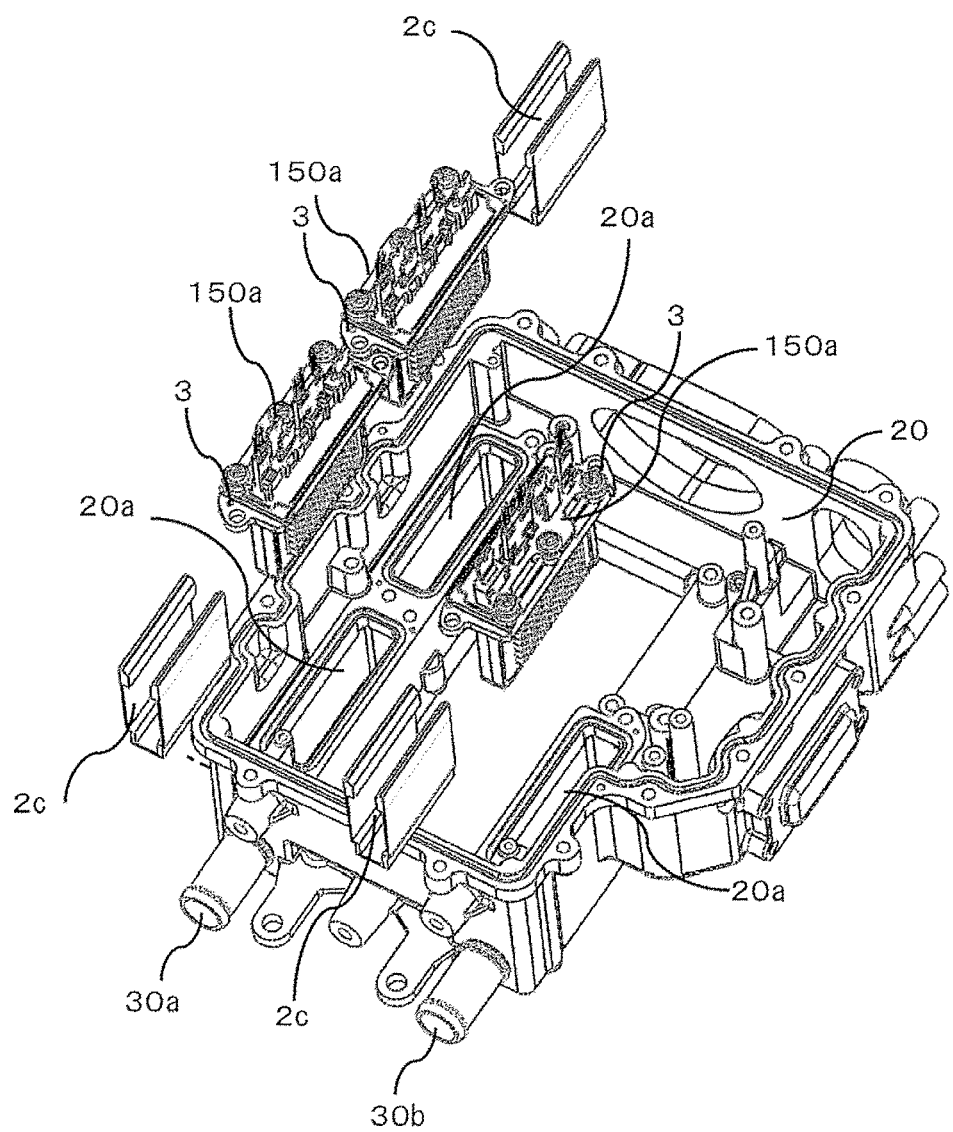
FIG. 12 is a perspective view of a power converter 200 of a third example.

FIG. 12 illustrates a modification example in which three power semiconductor modules 150a are respectively housed in different module housing spaces 20a.

In this embodiment, three module housing spaces 20a are formed in a casing 20. The three module housing spaces 20a are connected in series and form a refrigerant flow path from an inlet pipe 30a to an outlet pipe 30b. The first example and the second example are different from this example in that the three power semiconductor modules 150a are housed in one module housing space 20a.

Similar to the first example and the second example, the power semiconductor module 150a is housed in the module housing space 20a in a state where a flow path forming member 2c is mounted. In this embodiment, the flow path forming member 2c is mounted on each of the three power semiconductor modules 150a.

In this embodiment, three module housing spaces 20a are necessary to be provided in the casing 20, but since the flow path forming members 2c can be made small, manufacturability of the flow path forming member 2c itself is increased. Furthermore, since three power semiconductor modules are not necessary to be inserted into the module housing space after all three power semiconductor modules are mounted on the flow path forming member, assemblability is also improved.

In this embodiment, similar to the second example, a flow path branching in two is configured in the power semiconductor module. Furthermore, the structure is provided with a module having a flange section 3 and is sealed by providing an O-ring in a bottom surface of the flange without using a cover 5. As this embodiment, a sealing method of the power semiconductor module may not be the side surface sealing but may be a bottom surface sealing of the flange.

Fourth Example

Figure 13:
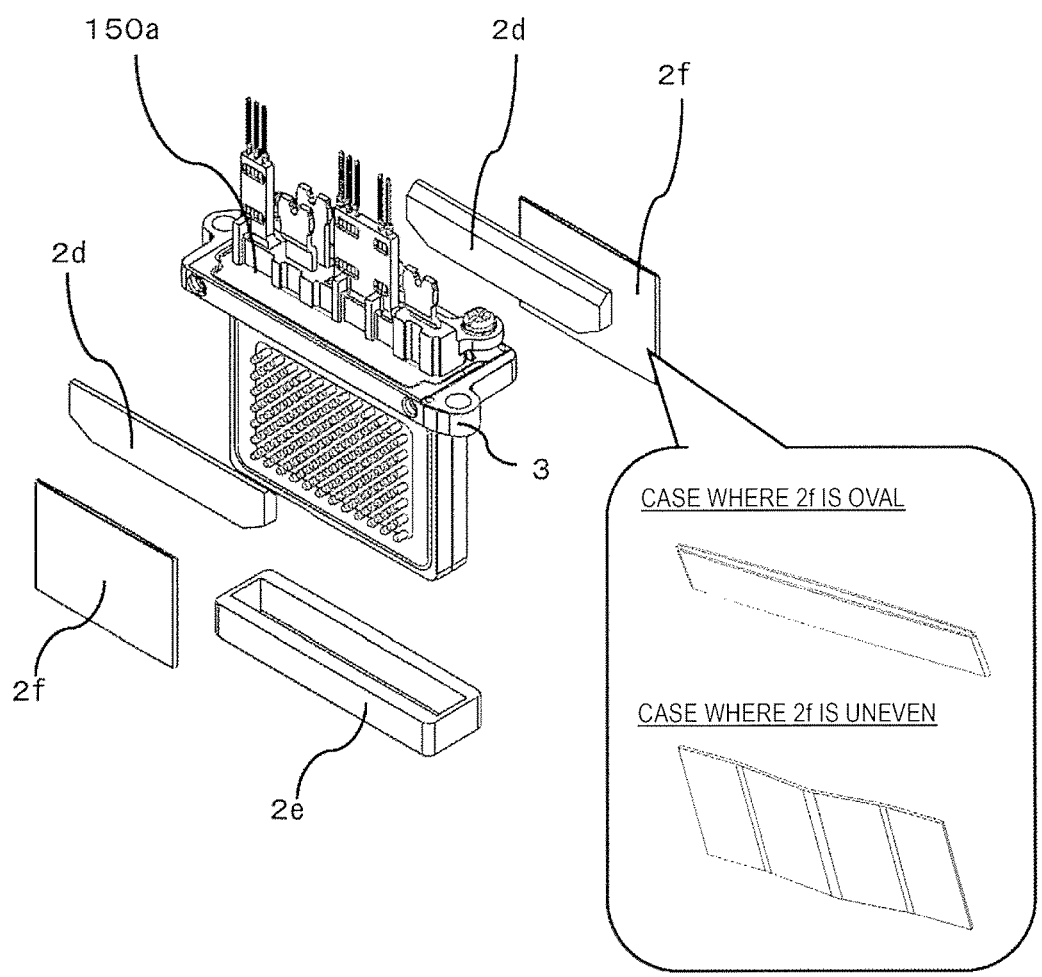
FIG. 13 is a perspective view illustrating a configuration of a flow path forming member of a fourth example.
Figure 14:
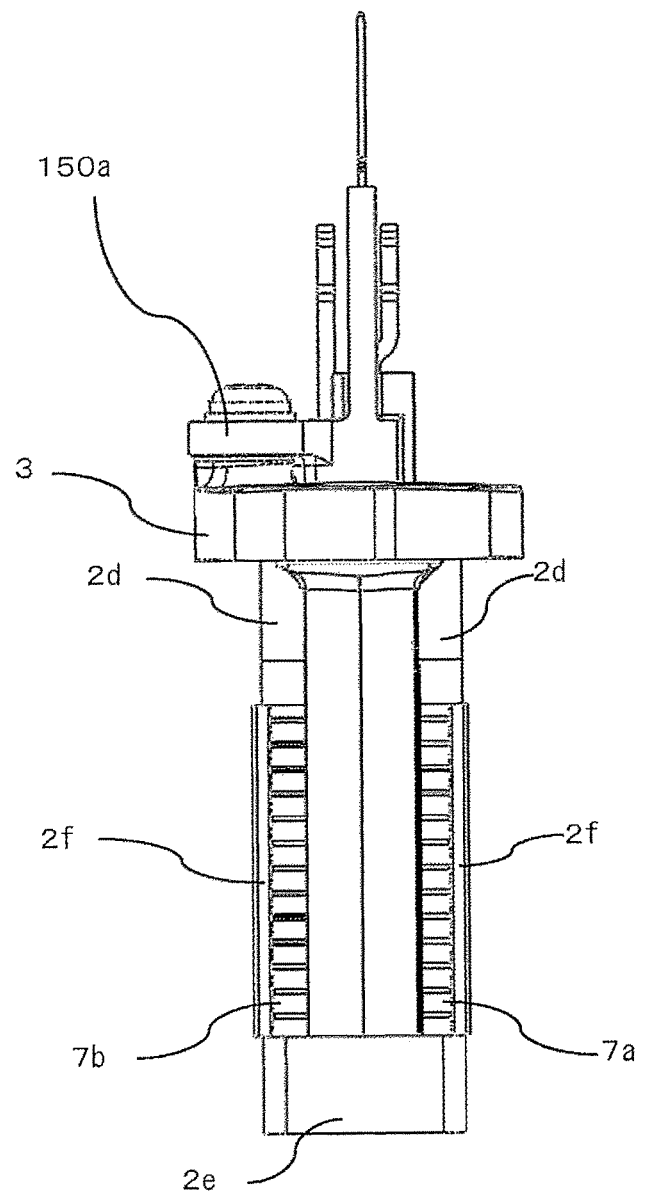
FIG. 14 is a view viewed from a side surface after assembling the components in FIG. 13.

In the third example, one flow path forming member 2c is provided with respect to one power semiconductor module 150a, but as illustrated in FIGS. 13 and 14, a plurality of members may be combined. In this embodiment, a modification example in which a flow path forming member is formed by combining a plurality of members is illustrated.

FIG. 13 is an exploded perspective view illustrating a structure of a case where a plurality of flow path forming members are combined and gaps other than heat radiation section are filled with the plurality of flow path forming members. FIG. 14 is a view viewed from a side surface after assembling the plurality of flow path forming members illustrated in FIG. 13.

In this embodiment, the flow path forming member is configured of an upper spacer 2d, a lower spacer 2e, and a side surface member 2f. The upper spacer 2d is disposed between heat radiation fins and a flange section of a power semiconductor module 150a. The lower spacer 2e is a member in which a concave section is formed so as to house a bottom surface of the power semiconductor module 150a and is disposed in a region opposite to a region in which the upper spacer 2d is disposed with a heat radiation fin forming region of the power semiconductor module 150a interposed therebetween. The upper spacer 2d has a function corresponding to the convex section 2c described in FIG. 9(b). Furthermore, the lower spacer 2e has a function corresponding to the convex section 2c and the bottom surface section 26 described in FIG. 9(b). The side surface member 2f is disposed in a position facing a heat radiation section 7 of the power semiconductor module 150a and forms a flow path through which the refrigerant flows between the side surface member 2f and the power semiconductor module.

The upper spacer 2d and the lower spacer 2e of the embodiment are formed of a rubber material. In addition, the side surface member 2f is a member made of metal having a leaf spring structure. The leaf spring structure has an oval shape, an uneven shape, and the like as illustrated in FIG. 13. The leaf spring structure is formed so that the side surface member 2f is urged toward the heat radiation fins of the power semiconductor module 150a.

As this embodiment, it is possible to reduce the manufacturing cost of one flow path forming member by configuring the flow path forming member to be divided into a plurality of portions with which the gaps is filled.

Each of the embodiments described above may be respectively used alone or in combination thereof. This is because it is possible to achieve the effects of each of the embodiments alone or synergistically. Furthermore, the invention is not limited to the embodiments described above as long as the characteristics of the invention are not impaired.

REFERENCE SIGNS LIST

1: sealing material of cover and casing
2: flow path forming member
2a: first flow path forming member
2b: second flow path forming member
2c: flow path forming member for each module
2d: upper spacer
2e: lower spacer
2f: side surface member
3: module flange section
5: cover
5a: cover opening section
5b: concave section
6: sealing material between module and cover
7: heat radiation section
7a: first heat radiation section
7b: second heat radiation section
7c: integral flange
8: sealing material between lower lid and casing
20: casing
20a: module housing space
20b: condenser module lower flow path
20c: inlet flow path
20d: outlet flow path
21: connector
22: lower lid
23: refrigerant traveling direction
23a: inlet side refrigerant traveling direction
23b: turn section refrigerant traveling direction
23c: capacitor module lower refrigerant traveling direction
23d: refrigerant traveling direction before branching and passing through the power semiconductor module
23e: refrigerant traveling direction immediately after branching and passing through the power semiconductor module
23f: refrigerant traveling direction after joining and passing through the power semiconductor module
23g: outlet-side refrigerant traveling direction
25a: first side wall section
25b: second side wall section
25c: convex section
26: bottom surface section
27a: first heat radiation section-side flow path
27b: second heat radiation section-side flow path 30a: inlet pipe
30b: outlet pipe
40: metal case
40a: portion holding heat radiation section 7
40b: portion coming into contact with sealing material on side surface
120: engine
130: thick section
131: thin section
136: battery
138: DC connector
140, 142: inverter circuit
144: heat radiation fin group
150: upper and lower arm series circuit
150a: two-in-one type power semiconductor module
153: collector electrode of upper arm IGBT
154: gate electrode
155: signal emitter electrode
156: upper arm diode
157: positive electrode terminal
157a: capacitor-side positive electrode bus bar
157b: power semiconductor module-side positive electrode terminal
158: negative electrode terminal
158a: capacitor-side negative electrode bus bar
158b: power semiconductor module-side negative electrode terminal
159: AC terminal
159a: output-side AC bus bar
159b: power semiconductor module-side AC terminal
160: control pin, signal pin, temperature output pin, and like
163: collector electrode of lower arm IGBT
164: gate electrode
165: signal emitter electrode
166: lower arm diode
169: intermediate electrode
172: control circuit
172a: control circuit substrate
174: driver circuit
174a: driver circuit substrate
174b: driver circuit substrate opening section
180: current sensor
188: AC connector
189: AC terminal stand
198: AC connector
200: power converter
328: upper arm IGBT
330: lower arm IGBT
500: capacitor module
501: capacitor cell
504: negative electrode-side capacitor terminal
506: positive electrode-side capacitor terminal
508: negative electrode-side power supply terminal
509: positive electrode-side power supply terminal

The invention claimed is:

1. A power converter comprising:
a power semiconductor module that converts a DC current into an AC current;
a first flow path forming body; and
a second flow path forming body that forms a housing space for storing the power semiconductor module and the first flow path forming body,
wherein the first flow path forming body is configured of a first side wall section facing the power semiconductor module, a second side wall section facing the first side wall section with the power semiconductor module interposed therebetween, and a bottom surface section straddling a bottom surface of the power semiconductor module and connecting the first side wall section and the second side wall section,
wherein the first side wall section forms a first flow path space between one surface of the power semiconductor module and the first side wall section,
wherein the second side wall section forms a second flow path space between the other surface of the power semiconductor module and the second side wall section, and
wherein cooling refrigerant flows through the housing space, the first flow path space, and the second flow path space.

2. The power converter according to claim 1,
wherein the power semiconductor module has a first heat radiation section facing the first side wall section, a second heat radiation section facing the second side wall section and facing the first heat radiation section with the power semiconductor module interposed therebetween, and a power semiconductor device disposed between the first heat radiation section and the second heat radiation section,
wherein the first heat radiation section has a region in which heat radiation fins are formed and a region in which heat radiation fins are not formed,
wherein the first flow path space is formed in a region facing the region in which heat radiation fins are formed,
wherein the first side wall section has a convex section, and
wherein the convex section protrudes toward the first heat radiation section in a region facing the region in which heat radiation fins are not formed.

3. The power converter according to claim 1,
wherein the first flow path forming body is formed so that the bottom surface section comes into contact with the bottom surface of the power semiconductor module.

4. The power converter according to any of claim 1, further comprising:
a cover covering the housing space,
wherein the cover has a concave section and an opening section formed on a bottom surface of the concave section,
wherein a terminal of the power semiconductor module penetrates the opening section, and
wherein the power semiconductor module is disposed such that a part of the power semiconductor module is fixed within the concave section.

5. The power converter according to any of claim 1,
wherein the power semiconductor module includes a first power semiconductor module and a second power semiconductor module,
wherein the second power semiconductor module is disposed facing the first power semiconductor module with the second side wall section interposed therebetween,
wherein the first flow path forming body further has a third side wall section facing the second side wall section with the second power semiconductor module interposed therebetween,
wherein the second side wall section forms a third flow path space between one surface of the second power semiconductor module and the second side wall section, wherein the third side wall section forms a fourth flow path space between the other surface of the second power semiconductor module and the third side wall section, wherein the first flow path forming body forms a connection flow path space, and wherein the first flow path forming body is formed such that the connection flow path space is connected to the first flow path space, the second flow path space, the third flow path space, and the fourth flow path space.

6. The power converter according to any of claim 1, wherein the first flow path forming body is formed by an elastic body.

7. The power converter according to claim 6, wherein the elastic body is silicon/EPDM/butyl/chloroprene-based rubber.

8. The power converter according to claim 6, wherein the elastic body is polyethylene/urethane/EPDM/butyl rubber/silicon-based foam.

9. The power converter according to claim 1, wherein the first flow path forming body is formed such that one or both of the first side wall section and the second side wall section has a leaf spring structure for being urged toward the power semiconductor module.

\* \* \* \* \*